(12) United States Patent
Gutierrez-Aitken et al.

(10) Patent No.: US 6,376,867 B1
(45) Date of Patent: Apr. 23, 2002

(54) HETEROJUNCTION BIPOLAR TRANSISTOR WITH REDUCED THERMAL RESISTANCE

(75) Inventors: Augusto L. Gutierrez-Aitken, Redondo Beach; Aaron K. Oki, Torrance; Patrick T. Chin, Marina Del Rey; Dwight C. Streit, Seal Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/631,597

(22) Filed: Aug. 3, 2000

(51) Int. Cl.[7] .......................................... H01L 31/0328
(52) U.S. Cl. ........................ 257/197; 257/200; 438/312
(58) Field of Search ................................ 257/197, 198, 257/200; 438/312, 309, 313, 315, 317

(56) References Cited

U.S. PATENT DOCUMENTS

| 5,041,882 A | * | 8/1991 | Katoh |
| 5,734,193 A |   | 3/1998 | Bayraktaroglu et al. |
| 5,946,582 A | * | 8/1999 | Bhat |
| 6,049,099 A | * | 4/2000 | Vaccaro et al. |

OTHER PUBLICATIONS

S. Yamahata et al., "Over–220–GHz–fnd–$f_{max}$InP/InGaAs Double–Heterojunction Bipolar Transistors with a New Hexagonal–Shaped Emitter", IEEE, 0703–2966–X/95, pp. 163–166, 1995.

D. Caffin et al., "Base–Collector Leakage Currents in InP/InGaAs Double Heterojunction Bipolar Transistors", *IEEE Transactions on Electron Devices*, vol. 44, No. 6, Jun. 1997, pp. 930–936.

H. Fukano et al., "High Speed InP/GaAs Heterojunction Phototransistors Employing a Nonalloyed Electrode Metal as a Reflector", *IEEE Journal of Quantum Electronics*, vol. 30, No. 12, Dec. 1994, pp. 2889–2895.

L. Lunardi et al., "Integrated p–i–n/HBT Photoreceivers for Optical Communication", IEEE, 0–7803–3393–04, IEDM 96–645, pp. 26.1.1–26.1.4, 1996.

\* cited by examiner

*Primary Examiner*—Tuan H. Nguyen
(74) *Attorney, Agent, or Firm*—Antonelli, Terry, Stout & Kraus, LLP

(57) ABSTRACT

The performance of a heterojunction bipolar transistor (HBT) operating at high power is limited by the power that can be dissipated by the device. This, in turn, is limited by the thermal resistance of the device to heat dissipation. In a typical HBT, and especially InP-based HBTs, heat generated during operation is concentrated near the collector-base junction. In order to more efficiently dissipate heat downward through the device to the substrate, both the collector and the sub-collector are formed of InP, which has a substantially lower thermal resistance than other typically used semiconductor materials.

20 Claims, 5 Drawing Sheets

| Material | Thermal Conductivity (W/cm-K) |
|---|---|
| GaAs | 0.44 |
| $Al_{0.3}Ga_{0.7}As$ | 0.17 |
| InP | 0.68 |
| InGaAs (Lattice Matched to InP) | 0.048 |
| InAlAs (Lattice Matched to InP) | ~0.05 |
| Gold | 3.17 |

HETEROJUNCTION BIPOLAR TRANSISTOR WITH REDUCED THERMAL RESISTANCE

FIELD OF THE INVENTION

The present invention relates generally to heterojunction bipolar transistors (HBTs), and, more particularly, to HBTs constructed to have reduced thermal resistance to permit rapid dissipation of heat.

BACKGROUND OF THE INVENTION

In HBTs operating at high power, the performance of the device is limited by the amount of power that can be dissipated in the device. Typically, a high power HBT will generate a large amount of heat which must be dissipated quickly to permit proper operation.

Recently, metallic thermal shunts have been developed to permit dissipation of heat from the collector of the HBT device. Typically, in any HBT, and especially in InP based HBTs, most of the power dissipation and heat generation are located in the upper region of the collector layer near the base layer, where there is a large voltage drop and a large current. FIG. 1 shows an HBT with a metallic thermal shunt designed in accordance with known principles to dissipate this heat.

Referring to FIG. 1, an HBT 110 is shown. This HBT is constructed with a substrate 114 formed of InP, a sub-collector 116 formed on the substrate, a collector 118 formed on the sub-collector, a base 120 formed on the collector and an emitter 122 formed on the base. An emitter metal 124 is provided on the emitter 122 (with collector metal being provided on the sub-collector 116 and base metal provided on the base 120).

As can be seen in FIG. 1, the majority of the heat generated during operation of the HBT 110 is located in a region 112 near the base-collector junction. In order to dissipate this heat to the substrate, a metallic thermal shunt 126 is coupled between the emitter metal 124 and the substrate 114. Thus, the heat generated in the collector 118 will dissipate through the base 120, the emitter 122, the emitter metal 124 and the metallic thermal shunt 126 to the substrate 114. It is noted that this arrangement is also taught in U.S. Pat. No. 5,734,193 to B. Bayraktaroglu et al.

From their studies of the thermal shunt technique described above, the inventors have noted certain disadvantages. The first of these is that the heat dissipation is limited by the fact that the heat must go through the base and emitter layers (and an emitter cap layer if one is used), and these layers generally have relatively low thermal conductivity, especially in InP-based HBTs. For example, the material used in the base of InP-based HBTs is the ternary InGaAs that has a very low thermal conductivity. Furthermore, in InP-based HBTs, the emitter material is typically the ternary semiconductor InAlAs, which also has a very poor thermal conductivity. The thermal shunt approach would provide limited improvement for these type of devices. Also, InGaAs is generally used as a cap layer on top of the emitter to improve the ohmic contact resistance to the emitter, which adds another layer with low thermal conductivity in the path for heat dissipation.

The metallic thermal shunt technique was initially developed for AlGaAs/GaAs—based HBTS. In these HBTs, the emitter layer consists of the ternary semiconductor AlGaAs, which has a poor thermal conductivity (see FIG. 4). Therefore, the thermal shunt technique also provides limited improvement in this instance.

A second disadvantage of the thermal shunt approach is the fact that it requires an extra processing step to construct the thermal shunt after the device itself is completed. Also, additional space is required for the shunt, thereby increasing the overall size of the device.

SUMMARY OF THE INVENTION

It is an object of the present invention to provide an HBT with improved heat dissipation.

It is a further object of the present invention to provide an HBT in which heat is dissipated downward to the substrate directly without the need for a thermal shunt.

It is still a further object of the present invention to provide an HBT with reduced thermal resistance between the heat generated near the collector-base junction and the substrate.

Yet another object of the present invention is to provide a method of fabricating an HBT to improve heat dissipation downward to the substrate.

To achieve these and other objects, an HBT is provided with a collector and a sub-collector which are each comprised of InP and located relative to one another so that heat generated in the collector during operation of the HBT dissipates downward from the collector through the sub-collector into the substrate.

DETAILED DESCRIPTION

Figure 1:
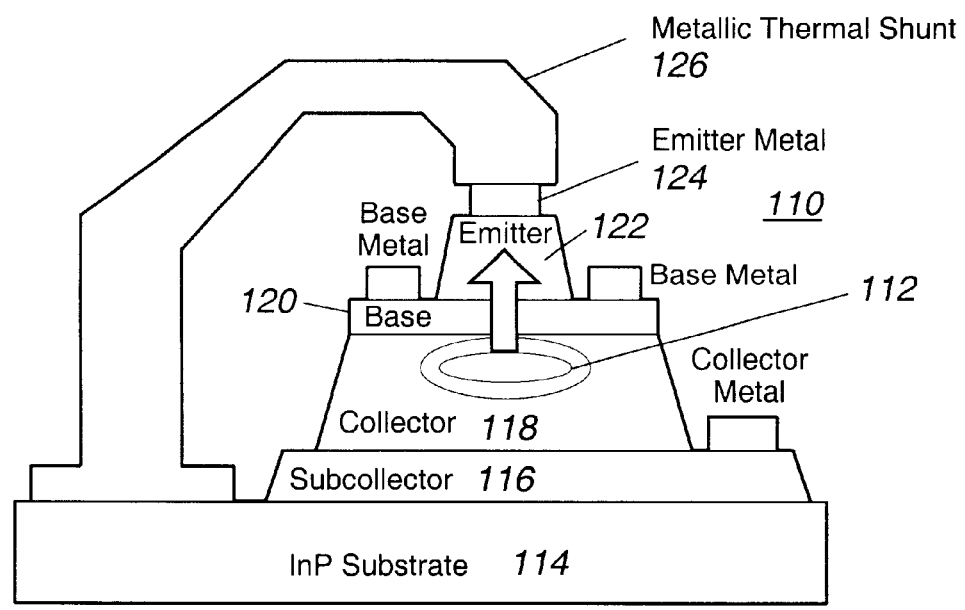
FIG. 1 is a prior art HBT with a thermal shunt to dissipate heat from the collector to the substrate through the base and emitter.
Figure 2:
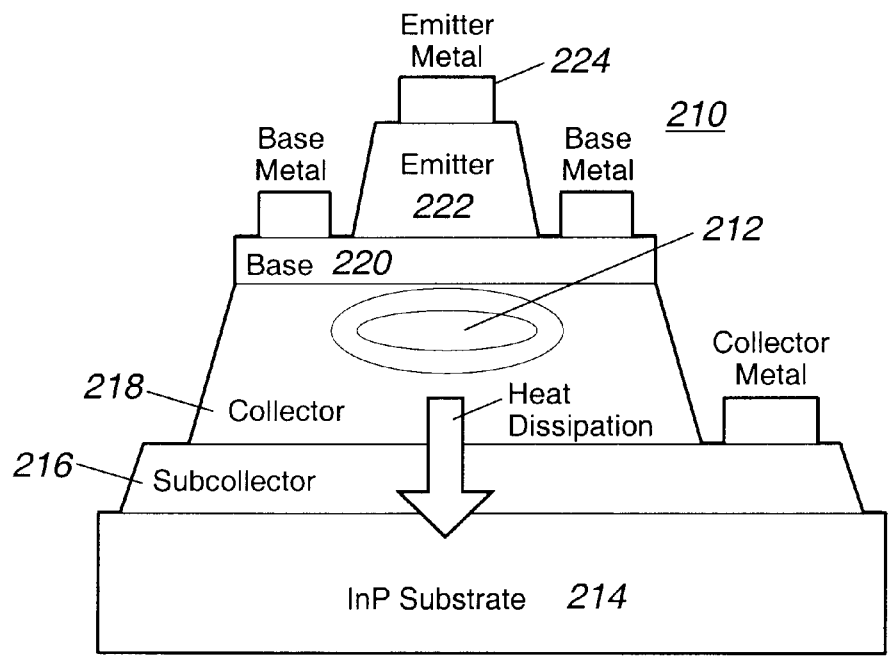
FIG. 2 is an illustration of the InP-based HBT for explaining the principle of the present invention.

Referring to FIG. 2, as discussed above for the prior art FIG. 1 device, most of the heat generated in an HBT, and especially in an InP-based HBTs, is concentrated at a location in the collector 218 near the collector-base junction. Because of the proximity of this heat to the upper portion of the device, prior art structures have naturally sought to dissipate the heat upwards through the base 220 and the emitter 222. However, from their studies of this matter, the inventors have determined that a better approach is to dissipate the heat downward through the collector 218 and the sub-collector 216 directly into the substrate 214, as illustrated in FIG. 2.

The performance of an HBT operating at high power is limited by the power than can be dissipated in the device, which depends on the thermal resistance of the device $(R_{th})$. $R_{th}$ is defined as $$R_{th} = \frac{t_s}{A \cdot K_s}$$

where $t_s$ is the semiconductor layer thickness, A is the device area, and $K_s$ is the semiconductor thermal conductivity.

The collector and sub-collector structure of a typical InP-based HBT is usually fabricated using a combination of InGaAs and InP layers as depicted in FIGS. 3(a)–3(d). The thermal conductivities at room temperature of five common semiconductor materials and gold used in the fabrication of HBTs are listed in the table shown in FIG. 4. The thermal conductivity is given in units of Watt per Centimeter per degree Kelvin.

Semiconductor materials with high thermal conductivity, such as InP or GaAs, conduct heat readily through them and materials with low thermal conductivity, such as InGaAs or InAlAs, behave more like thermal insulators.

Figure 3A:
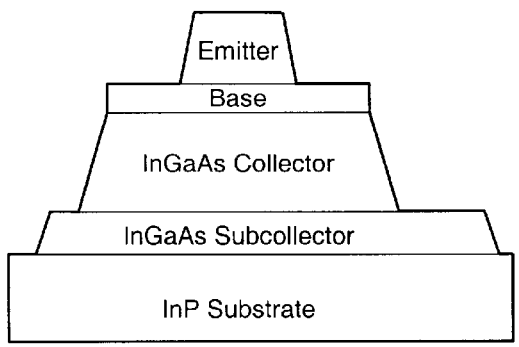
FIGS. 3A–3D are illustrations of various devices studied by the inventors in developing the present invention.
Figure 3B:
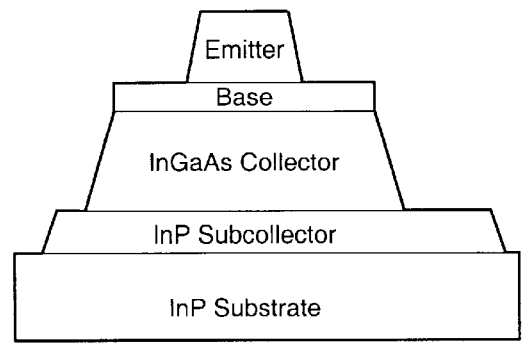
Figure 3C:
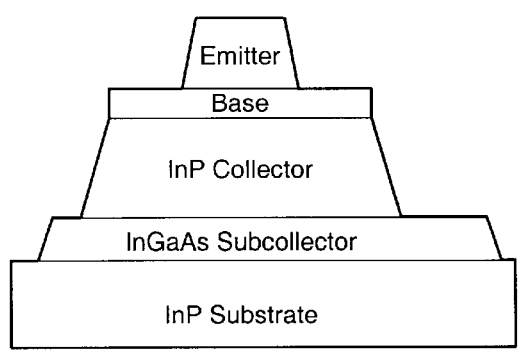
Figure 3D:
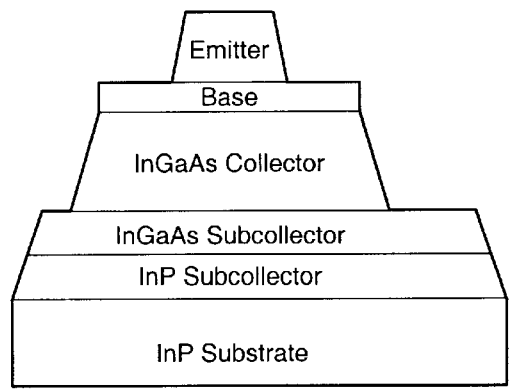

All the structures illustrated in FIGS. 3(a)–3(d) have a layer with poor thermal conductivity in the collector (e.g., FIGS. 3(a) and 3(b)) or sub-collector (e.g., FIGS. 3(a), 3(b) and 3(d)) or both (e.g., FIG. 3(a)). As a consequence, the heat generated in the collector cannot be efficiently dissipated.

Figures 4, 5:
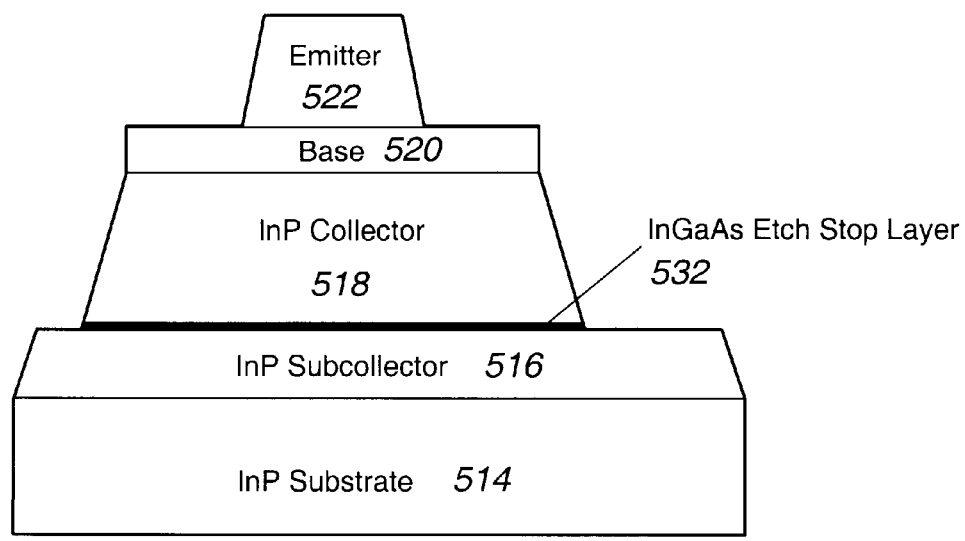
FIG. 4 is a table of thermal conductivity at room temperature for semiconductors used in HBTs and of gold, for comparison.
FIG. 5 shows an HBT constructed in accordance with a first embodiment of the present invention.

In accordance with the present invention, as illustrated in FIG. 5, InP semiconductor materials are used for both the collector 518 and the sub-collector 516. With regard to this, it is noted that the thermal conductivity of InP is approximately fifteen times higher than that of the thermal conductivity of InGaAs. Thus, by forming both the collector 518 and the sub-collector 516 of InP material, the desired downward flow of heat from the collector through the sub-collector to the substrate 514 is encouraged. As noted above, typically, the base and emitter layers contain material with low thermal conductivity such as InGaAs, so that the relative amount of heat dissipated in the structure of FIG. 5 in the downward direction is much greater than that which would typically be dissipated in the upward direction.

It is noted that very thin layers of InGaAs or InAlAs ternary layer could be used as etching stop layers. This is shown, for example, by the layer 532 in FIG. 5 and the layers 632 shown in a second embodiment of the present invention in FIG. 6. Typically, these layers 532 and 632 would be made of low thermal conductivity material such as InGaAs or InAlAs. However, they have determined that if these layers are kept to a thicknes below 100 Å, the effect of these etching stop layers 532 and 632 on thermal resistance of the device will be minimal. Accordingly, in accordance with embodiment of FIG. 5 and 6, it is possible to provide these extremely thin etch stop layers 532 and 632 to assist in the fabrication of the HBT without adversely affecting the desired heat dissipation discussed above.

Figure 6:
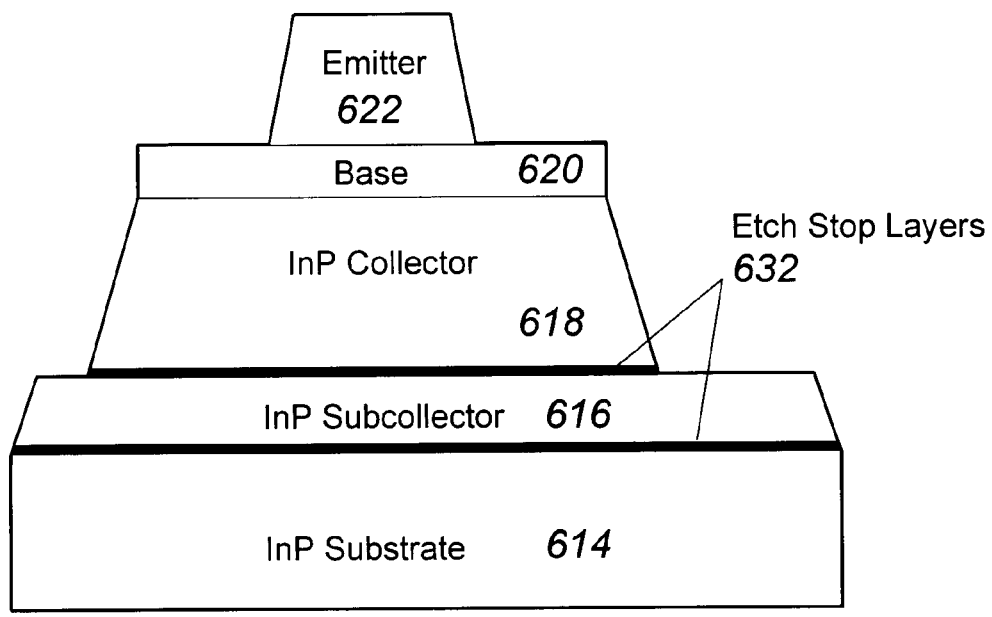
FIG. 6 shows an HBT constructed in accordance with a second embodiment of the invention.
Figure 7:
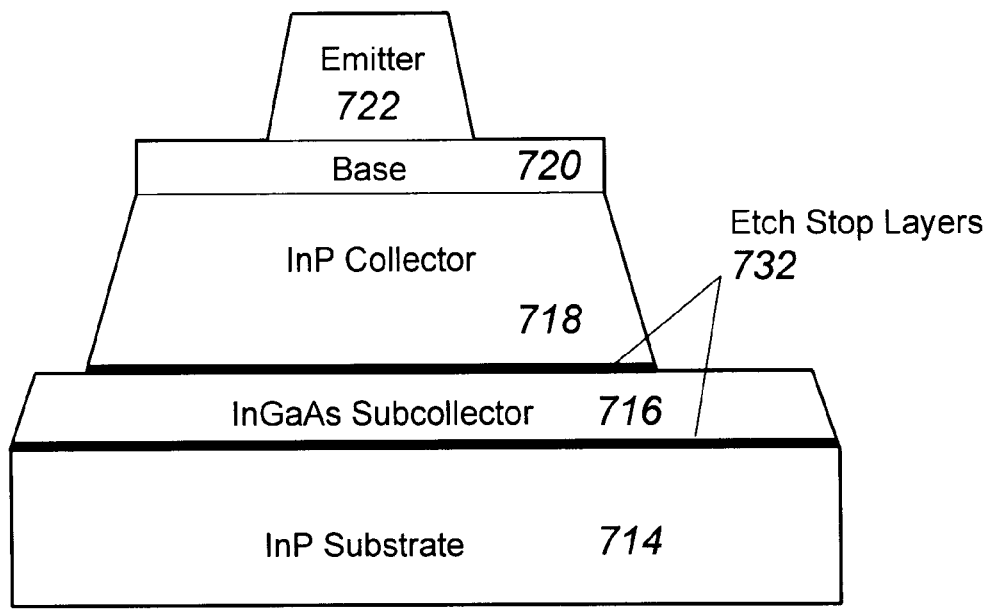
FIG. 7 shows a test device studied by the inventors to compare with the device shown in FIG. 6.
Figure 8:
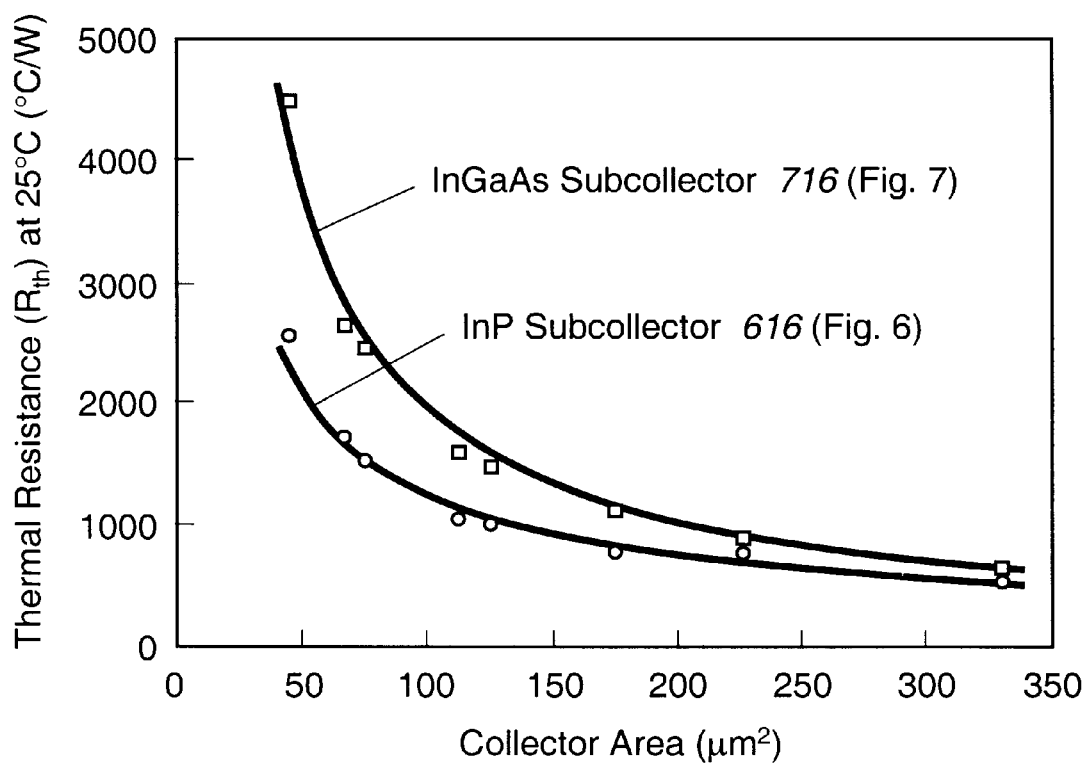
FIG. 8 shows comparative results between the device shown in FIG. 6 and the device shown in FIG. 7 to illustrate measured thermal resistance for the respective HBTs as a function of collector area.

The thermal resistance $R_{th}$ of the HBT structure of FIG. 6 was experimentally compared with the device shown in FIG. 7 to demonstrate and measure the effect of the present invention. The comparison device of FIG. 7 is substantially the same as that of FIG. 6, except for the fact that an InGaAs sub-collector 716 is used instead of the InP sub-collector 616 of FIG. 6. In other words, the device of FIG. 7 includes both an InP collector 718 and an InP substrate 714, but does not include an InP sub-collector. FIG. 8 shows the results of measurement of the thermal resistance $R_{th}$ for several devices constructed in accordance with both FIGS. 6 and 7, with each of the devices differing by increasing the collector areas. As can be seen in FIG. 8, the device as constructed in accordance with FIG. 6 clearly have lower thermal resistances, especially as the collector area becomes smaller.

In accordance with the principles of the present invention, a method and device are provided which significantly reduce the thermal resistance in the downward direction in an InP-based HBT. Thus, heat generated in the collector can go through the sub-collector to the substrate without the thermal resistance previously encountered in the base and emitter layers. In addition, the arrangement of the present invention has distinct advantages over the prior art structure since it is simple and does not require additional processing steps.

Although the present invention is intended to be an alternative to the prior art metallic thermal shunt approach, it is noted that the present invention can be used in addition to providing a metallic thermal shunt if desired. In other words, in addition to providing the downward path for heat dissipation in accordance with the present invention, a thermal shunt can be used similar to the arrangement shown in FIG. 1 to dissipate the relatively small amount of heat which does go upward in the device through the thermal shunt to the substrate.

It is noted that the reduced thermal resistance HBT described above has many applications in microwave circuits and high efficiency power amplifiers for phased array components and defense and space applications.

While the present invention has been described in detail and pictorially in the accompanying drawings, it is not limited to such details since many changes and modifications recognizable to those of ordinary skill in the art may be made to the invention without departing from the spirit and the scope thereof.

We claim:

1. A heterojunction bipolar transistor (HBT) comprising:
a substrate;
a sub-collector formed on the substrate;
a collector having an area of less than 200 $\mu m^2$ formed on the sub-collector;
a base formed on the collector; and
an emitter formed on the base,
wherein the collector and sub-collector are each comprised of InP and located relative to one another so that heat generated in the collector during operation of the HBT dissipates from the collector through the sub-collector to the substrate.

2. An HBT according to claim 1, wherein the substrate is comprised of InP.

3. An HBT with low thermal resistance comprising:
a substrate;
a sub-collector formed on the substrate;
a collector having an area of less than 200 $\mu m^2$ formed on the sub-collector;
a base formed on the collector; and
an emitter formed on the base,
wherein the substrate, the sub-collector and the collector all consist essentially of InP and are located relative to one another so that heat generated in the collector during operation of the HBT is dissipated through the collector and the sub-collector into the substrate.

4. An HBT according to claim 3, wherein the substrate is in direct contact with the sub-collector.

5. An HBT according to claim 3, wherein the collector is in direct contact with the sub-collector.

6. An HBT according to claim 3, wherein the substrate is in direct contact with the sub-collector and the collector is in direct contact with the sub-collector.

7. An HBT with low thermal resistance comprising:

a substrate;

a sub-collector formed on the substrate;

a collector formed on the sub-collector;

a base formed on the collector; and an emitter formed on the base, wherein the substrate, the sub-collector and the collector all consist essentially of InP and are located relative to one another so that heat generated in the collector during operation of the HBT is dissipated through the collector and the sub-collector into the substrate, further comprising an etch stop layer having a thickness of less than 100 Å formed between the collector and the sub-collector.

8. An HBT according to claim 7, wherein the etch stop layer is comprised of InGaAs.

9. An HBT according to claim 7, wherein the etch stop layer is comprised of InAlAs.

10. A heterojunction according to claim 7, wherein the collector has an area less than 200 $\mu m^2$.

11. An HBT with low thermal resistance comprising:

a substrate;

a sub-collector formed on the substrate;

a collector formed on the sub-collector;

a base formed on the collector; and an emitter formed on the base, wherein the substrate, the sub-collector and the collector all consist essentially of InP and are located relative to one another so that heat generated in the collector during operation of the HBT is dissipated through the collector and the sub-collector into the substrate, further comprising an etch stop layer having a thickness of less than 100 Å formed between the sub-collector and the substrate.

12. An HBT according to claim 11, wherein the etch stop layer is comprised of InGaAs.

13. An HBT according to claim 11, wherein the etch stop layer is comprised of InAlAs.

14. A heterojunction according to claim 11, wherein the collector has an area less than 200 $\mu m^2$.

15. An HBT comprising:

a substrate;

a sub-collector formed on the substrate;

a collector having an area of less than 200 $\mu m^2$ formed on the sub-collector;

a base formed on the collector;

an emitter formed on the base; and means for providing heat dissipation for heat generated in the collector during operation of the HBT to dissipate through the collector and the sub-collector into the substrate.

16. An HBT according to claim 15, wherein said means for dissipating comprises forming the collector, the sub-collector and the substrate to each consist essentially of InP and locating the collector, sub-collector and substrate relative to one another to permit the heat dissipation from the collector through the sub-collector to the substrate without heat transfer being hindered by intervening layers of material other than InP.

17. An HBT, comprising:

a substrate;

a sub-collector formed on the substrate;

a collector formed on the sub-collector;

a base formed on the collector;

an emitter formed on the base; and means for providing heat dissipation for heat generated in the collector during operation of the HBT to dissipate through the collector and the sub collector into the substrate;

wherein said means for dissipating comprises forming the collector, the sub-collector and the substrate to each consist essentially of InP and locating the collector, sub-collector and substrate relative to one another to permit the heat dissipation from the collector through the sub-collector to the substrate without heat transfer being hindered by Intervening layers of material other than InP further comprising forming etch stop layers between at least one of the collector and sub-collector and the sub-collector and substrate, wherein the etch stop layers are less than 100 Å so as not to substantially hinder heat transfer from the collector through the sub-collector to the substrate.

18. An HBT according to claim 17, wherein the etch stop layer consists essentially of InGaAs.

19. An HBT according to claim 17, wherein the etch stop layer consists essentially of InAlAs.

20. A heterojunction according to claim 17, wherein the collector has an area less than 200 $\mu m^2$.

* * * * *